(12) United States Patent
Toda et al.

(10) Patent No.: US 12,122,915 B2
(45) Date of Patent: *Oct. 22, 2024

(54) CURABLE ORGANOPOLYSILOXANE COMPOSITION HAVING EXCELLENT COLD RESISTANCE, AND A PATTERN FORMING METHOD

(71) Applicant: DOW TORAY CO., LTD., Tokyo (JP)

(72) Inventors: Nohno Toda, Ichihara (JP); Manabu Sutoh, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 577 days.

This patent is subject to a terminal disclaimer.

(21) Appl. No.: 17/285,792

(22) PCT Filed: Oct. 15, 2019

(86) PCT No.: PCT/JP2019/040371
§ 371 (c)(1),
(2) Date: Apr. 15, 2021

(87) PCT Pub. No.: WO2020/080326
PCT Pub. Date: Apr. 23, 2020

(65) Prior Publication Data
US 2021/0371659 A1  Dec. 2, 2021

(30) Foreign Application Priority Data
Oct. 18, 2018 (JP) .................. 2018-196615

(51) Int. Cl.
C08K 3/36 (2006.01)
B05D 1/26 (2006.01)
B81B 7/02 (2006.01)
C08G 77/00 (2006.01)
C08G 77/08 (2006.01)
C08G 77/12 (2006.01)
C08G 77/20 (2006.01)
C08K 5/00 (2006.01)
C08K 5/5425 (2006.01)
C08K 5/544 (2006.01)
C08K 9/06 (2006.01)
C08L 83/04 (2006.01)

(52) U.S. Cl.
CPC .............. *C08L 83/04* (2013.01); *B05D 1/26* (2013.01); *B81B 7/02* (2013.01); *C08G 77/08* (2013.01); *C08G 77/12* (2013.01); *C08G 77/20* (2013.01); *C08G 77/80* (2013.01); *C08K 3/36* (2013.01); *C08K 5/0025* (2013.01); *C08K 5/5425* (2013.01); *C08K 5/544* (2013.01); *C08K 9/06* (2013.01); *B05D 2518/12* (2013.01); *C08K 2201/003* (2013.01); *C08L 2203/20* (2013.01); *C08L 2205/025* (2013.01)

(58) Field of Classification Search
CPC ...... C08K 3/36; C08K 5/0025; C08K 5/5425; C08K 9/06; C08K 2201/003; C08K 5/5445; C08L 83/04; C08L 2203/20; C08L 2205/025; C08G 77/08; C08G 77/20; C08G 77/80; B05D 1/26; B05D 2518/12; B05D 7/24; B81B 7/02; C09D 183/04

USPC ........................................................ 524/588
See application file for complete search history.

(56) References Cited

U.S. PATENT DOCUMENTS

| | | |
|---|---|---|
| 6,304,000 B1 | 10/2001 | Isshiki et al. |
| 11,384,244 B2 | 7/2022 | Sutoh |
| 11,551,988 B2 | 1/2023 | Sutoh |
| 2008/0031583 A1* | 2/2008 | Ohtsu .................. G02B 6/4214 385/130 |
| 2009/0045166 A1 | 2/2009 | Li |
| 2010/0276721 A1 | 11/2010 | Yoshitake et al. |
| 2011/0245426 A1 | 10/2011 | Nabeta et al. |
| 2012/0125436 A1 | 5/2012 | Cummings et al. |
| 2013/0065999 A1 | 3/2013 | Takanashi |
| 2013/0092423 A1 | 4/2013 | Hamada et al. |
| 2013/0248163 A1 | 9/2013 | Bhagwagar et al. |

(Continued)

FOREIGN PATENT DOCUMENTS

| | | |
|---|---|---|
| CN | 101304813 A | 11/2008 |
| EP | 2612887 A1 | 7/2013 |

(Continued)

OTHER PUBLICATIONS

D.W. Van Krevelen, "Properties of Polymers: Their Estimation and Correlation with Chemical Structure", Elsveier Scientific Publishing Co., 1976, pp. 348-349.

(Continued)

*Primary Examiner* — Hannah J Pak
(74) *Attorney, Agent, or Firm* — WARNER NORCROSS + JUDD LLP (57) ABSTRACT

A curable organopolysiloxane composition having rheological properties suitable for precision application and fine pattern formation by a fine droplet coating apparatus such as a jet dispenser, along with a method for forming a pattern using the same, and an electronic component using the same, is provided herein. The curable organopolysiloxane composition is hydrosilylation reaction curable and can be precisely applied by a jet dispenser, etc. The composition has a viscosity at a strain speed of 1,000 (1/s) of 2.0 Pa·s or less, while the viscosity at a strain speed of 0.1 (1/s) is a value 50.0-fold or more the viscosity at a strain speed of 1,000 (1/s). The content of silicon atom-bonded aromatic functional groups in the composition is within a range of from 1.0 to 6.0 mass %.

12 Claims, 1 Drawing Sheet

(56) References Cited

U.S. PATENT DOCUMENTS

| | | | |
|---|---|---|---|
| 2013/0256741 A1 | 10/2013 | Harkness et al. | |
| 2014/0315032 A1 | 10/2014 | Bebenroth et al. | |
| 2015/0200317 A1 | 7/2015 | Kretschmann et al. | |
| 2015/0210853 A1 | 7/2015 | Fujisawa et al. | |
| 2017/0121462 A1 | 5/2017 | Fujisawa et al. | |
| 2017/0130006 A1 | 5/2017 | Saito et al. | |
| 2017/0158937 A1* | 6/2017 | Bhagwagar | F28F 23/00 |
| 2018/0179384 A1 | 6/2018 | Matsumoto et al. | |
| 2018/0258229 A1 | 9/2018 | Achenbach et al. | |
| 2020/0270500 A1 | 8/2020 | Ota | |
| 2020/0277493 A1 | 9/2020 | Sutoh | |
| 2020/0347229 A1 | 11/2020 | Fujisawa et al. | |
| 2020/0407600 A1 | 12/2020 | Swier et al. | |

FOREIGN PATENT DOCUMENTS

| | | |
|---|---|---|
| JP | H1012546 A | 1/1998 |
| JP | H1112546 A | 1/1999 |
| JP | 2001002922 A | 1/2001 |
| JP | 2008222828 A | 9/2008 |
| JP | 2010106223 A | 5/2010 |
| JP | 2013089619 A | 5/2013 |
| JP | 2013100464 A | 5/2013 |
| JP | 2013100516 A | 5/2013 |
| JP | 2013253210 A | 12/2013 |
| JP | 2014503680 A | 2/2014 |
| JP | 2014506263 A | 3/2014 |
| JP | 2014210851 A | 11/2014 |
| JP | 2015091576 A | 5/2015 |
| JP | 2015530940 A | 10/2015 |
| JP | 2017179038 A | 10/2017 |
| JP | 2018003194 A | 1/2018 |
| JP | 2018009127 A | 1/2018 |
| TW | 201817820 A | 5/2018 |
| WO | 2012050105 A1 | 4/2012 |
| WO | 2014050318 A1 | 4/2014 |
| WO | 2015155950 A1 | 10/2015 |
| WO | 2019054370 A1 | 3/2019 |
| WO | 2019054371 A1 | 3/2019 |

OTHER PUBLICATIONS

English translation of International Search Report for PCT/JP2018033632 dated Dec. 18, 2018, 2 pages.
English translation of International Search Report for PCT/JP2018033633 dated Dec. 11, 2018, 2 pages.
Machine assisted English translation of JP2008222828A obtained from https://worldwide.espacenet.com/patent on Nov. 9, 2023, 12 pages.
Machine assisted English translation of JP2013100464A obtained from https://worldwide.espacenet.com/patent on Nov. 9, 2023, 14 pages.
Machine assisted English translation of JP2013253210A obtained from https://worldwide.espacenet.com/patent on Nov. 9, 2023, 47 pages.
Machine assisted English translation of JP2014210851A obtained from https://worldwide.espacenet.com/patent on Nov. 9, 2023, 13 pages.
Machine assisted English translation of JP2015091576A obtained from https://worldwide.espacenet.com/patent on Nov. 9, 2023, 22 pages.
International Search Report for PCT/JP2019/040371 dated Dec. 17, 2019, 2 pages.
Machine assisted English translation of JPH1012546A obtained from https://patents.google.com/patent on Jul. 15, 2021, 5 pages.
Machine assisted English translation of JP2001002922A obtained from https://patents.google.com/patent on Jul. 15, 2021, 11 pages.
Machine assisted English translation of JP2013253210A obtained from https://patents.google.com/patent on Jul. 15, 2021, 21 pages.
Machine assisted English translation of WO2014050318A1 obtained from https://patents.google.com/patent on Jul. 15, 2021, 13 pages.
Machine assisted English translation of JP2015091576A obtained from https://patents.google.com/patent on Jul. 15, 2021, 11 pages.
Machine assisted English translation of JP2017179038A obtained from https://patents.google.com/patent on Jul. 15, 2021, 8 pages.
Machine assisted English translation of JP2018009127A obtained from https://patents.google.com/patent on Jul. 15, 2021, 9 pages.
Machine assisted English translation of WO2019054371A1 obtained from https://patents.google.com/patent on Jul. 15, 2021, 13 pages.
Machine assisted English translation of JP2018003194A obtained from <https://patents.google.com/patent> on Aug. 26, 2024, 12 pages.

* cited by examiner

CURABLE ORGANOPOLYSILOXANE COMPOSITION HAVING EXCELLENT COLD RESISTANCE, AND A PATTERN FORMING METHOD

CROSS-REFERENCE TO RELATED APPLICATIONS

This application is the U.S. National Stage of International Application No. PCT/JP2019/040371 filed on 15 Oct. 2019, which claims priority to and all advantages of Japanese Application No. 2018-196615 filed on 18 Oct. 2018, the contents of which are incorporated herein by reference.

TECHNICAL FIELD

The present invention relates to: a curable organopolysiloxane composition having excellent cold resistance of cured products in addition to having rheological properties suitable for precision application and fine pattern formation by a fine droplet coating apparatus such as a jet dispenser; a method for forming a pattern using the same; and an electronic component (including a MEMS device) or precursor thereof which includes a curable organopolysiloxane composition or a cured product thereof applied by a fine droplet coating apparatus such as a jet dispenser.

BACKGROUND ART

Curable organopolysiloxane compositions are widely used as protective agents or adhesive compositions for electrical or electronic components or for filling and sealing gaps in image display apparatuses such as mobile phones or touch panels, contributing to the improved reliability, durability, etc. thereof. In particular, single-liquid curable organopolysiloxane compositions which cure using a hydrosilylation reaction are advantageous over other materials for having excellent handling workability and curing speed, having excellent heat resistance of the cured product, and for allowing for control of the adhesion to a base material as well as the hardness of the cured product if so desired.

In contrast, there is a demand for electronic components, etc. obtained by forming a pattern of fine curable organopolysiloxane compositions on substrates such as electronic materials, as well as on image display apparatuses, etc. Such a pattern is made up of individual application regions which are each substantially dotted regions having a diameter of 1 mm or less or linear regions having a width of 1 mm or less, with a design in which these application regions are disposed in an infinite number and with high precision, such that the pattern can therefore be applied using a fine droplet coating apparatus such as an inkjet system or a dispenser coating system in industrial production.

Unfortunately, these existing curable organopolysiloxane compositions are liquids. When these compositions are applied using a fine droplet coating apparatus, even when a fine droplet coating apparatus including a fine nozzle with a thickness of 1000 μm or less is used, scattering or spreading (bleeding) is generated within a range exceeding the target application region, making it difficult to form a fine pattern. In contrast, an application object such as one of the same composition can be designed so as to exhibit a high viscosity in order to prevent droplet scattering or reduce the fluidity for precision application. However, if a composition having a high viscosity is designed so as to prevent droplet scattering, the high viscosity problematically tends to cause nozzle clogging and an increase in the application amount per dot, making it difficult to apply the composition using a fine droplet coating apparatus such as a jet dispenser. Moreover, the curing reaction in the nozzle problematically tends to progress and cause nozzle clogging.

In order to solve such problems, Patent Document 1 proposes a method for manufacturing a simple pattern using a curable polyorganosiloxane composition having excellent rapid curability by separately applying two types of curable organopolysiloxanes (which react by mixing) from two different nozzles and mixing the same on a base material. However, with this method, a fine droplet application apparatus corresponding to a nozzle for two-liquids is necessary, wherein the application is a multicomponent application and a liquid-separation application which are substantially dependent on the physical contact of the two liquids with the base material. Therefore, workability efficiency and precision application properties are insufficient and in terms of the curing characteristics in particular, the characteristics of the curability or cured product based on the complete mixing of both liquids may not be achieved. Thus, there has been a strong demand for a curable organopolysiloxane suitable for precision application and fine pattern formation using a fine droplet coating apparatus such as a single-liquid and jet dispenser, in terms of work efficiency, precision application, and the properties of the cured product.

In addition, in the field of semiconductor devices, using an MEMS (micro electromechanical systems) technique, micro electromechanical systems (MEMS) techniques have recently been used to diffuse MEMS devices such as small and highly integrated sensors. Compared to the prior art, miniaturization of the lead frame which is a conductor base material, along with the ultra-miniaturization and weight reduction of semiconductor chips provided by dicing, has progressed, with there having been a strong demand for an electronic component or precursor thereof formed by precisely applying the curable organopolysiloxane composition or cured product thereof and forming a fine pattern. In particular, a micro electromechanical systems (MEMS) device has been used within a wide temperature region ranging from low temperatures such as approximately −70° C. to room temperature. Therefore, even if it is used at low temperatures, there has been a strong demand for changes in the elastic modulus of the cured product, etc. that do not to deteriorate the reliability of devices. That is, in electronic component applications, in addition to the precision application properties and fine pattern formability of the curable organopolysiloxane composition, high cold resistance is required by the cured product after application.

The techniques described in Patent Documents 2 to 5 are known techniques for improving the cold resistance of compositions. Patent Document 2 proposes that the combined use of an organohydrogen silane compound and an organohydrogenpolysiloxane (which has silicon atom-bonded hydrogen atoms only at the terminals of a molecular chain) in a gel-type hydrosilylation reaction cured product at a certain ratio makes it possible to suppress changes in the elastic modulus at −75° C. to 25° C. Unfortunately, the composition is gel-like and not suitable for precision application/fine pattern formation, making it impossible to achieve sufficient hardness as a die attach agent. In contrast, in Patent Documents 3 and 4, while cold resistance is achieved using a large amount of an organopolysiloxane or branched organopolysiloxane having a resin structure. Unfortunately, in addition to insufficient cold resistance at −70° C., the present invention problematically cannot be applied to precision application and fine pattern formation.

Patent Document 5 proposes the use of an organopolysiloxane containing 1 mol % or more of phenyl groups for the purpose of improving the cold resistance of a silicone adhesive sheet; however, the present document is intended to form a sheet, the problems with precision application and fine pattern formation are not described or suggested, and the compositions described in the examples, etc. have not been applicable to precision application and fine pattern formation.

PRIOR ART DOCUMENTS

Patent Documents

Patent Document 1: JP 2015-091576 A
Patent Document 2: JP 2018-009127 A
Patent Document 3: JP 2001-002922 A
Patent Document 4: WO 2012/050105
Patent Document 5: JP 10-012546 A

SUMMARY OF THE INVENTION

Problems to be Solved by the Invention

The present invention has been created in order to solve the abovementioned problems, with an object of providing: a curable organopolysiloxane composition which is a single liquid, enables precision application and fine pattern formation by a fine droplet coating apparatus such as a jet dispenser, has excellent curability and handling workability, has particularly excellent cold resistance of the cured product, and can be used within a wide range of temperature regions; and a method of forming a pattern using the same. Further, an object of the present invention is to provide an electronic component or a precursor thereof including the composition or a cured product thereof.

Means for Solving the Problems

As a result of diligent research, the present inventors focused on the rheological properties of a composition and found that the use of a curable organopolysiloxane composition (having a great change in the viscosity and fluidity from a high shear region to a low shear region) (wherein, the content of silicon atom-bonded aromatic functional groups in the composition is within a certain range) can solve the abovementioned problems, leading to the present invention. That is, when shear is applied to the composition for ejection from a fine droplet coating apparatus, etc., the fluidity of the composition increases, enabling the smooth ejection thereof from a nozzle, etc. However, once the composition is ejected from the nozzle, etc. and the composition is opened from the shear at the time of ejection, the composition has greatly reduced fluidity and becomes highly viscous, preventing scattering or spreading (bleeding) from the application region of the pinpoint; moreover, the content of the silicon atom-bonded aromatic functional groups can be designed within a certain range, thereby solving the abovementioned problems. Moreover, an electronic component or precursor thereof formed by precisely applying the curable organopolysiloxane composition or cured product thereof and forming a fine pattern can be obtained, allowing the abovementioned problems to be solved.

That is, in order to solve the problems, an object of the present invention is to provide a curable organopolysiloxane composition, wherein the viscosity at a strain speed of 1,000 (1/s) is 2.0 Pa s or less, while the viscosity at a strain speed of 0.1 (1/s) is a value of 50.0-fold or more the viscosity at a strain speed 1,000 (1/s). Herein, the content of silicon atom-bonded aromatic functional groups in the composition is within a range of 1.0 to 6.0 mass %. In the composition, the viscosity at a strain speed of 1,000 (1/s) is preferably 1.5 Pa s or less, while the viscosity at a strain speed of 0.1 (1/s) is preferably 50 Pa s or more. Moreover, the viscosity at a strain speed of 1,000 (1/s) may be a value of 75.0-fold or more the viscosity at a strain speed of 0.1 (1/s) or alternatively may be a value of 100.0-fold or more. Moreover, the range of the content of the silicon atom-bonded aromatic functional groups in the composition may be within a range of 1.5 to 5.0 mass %, preferably within a range of 2.0 to 4.0 mass %.

Here, a known method can be used as the method for determining the viscosity at each strain speed, wherein, for example, the viscosity can be determined under the following determination conditions using a rheometer MCR-102 (available from Anton Paar GmbH).

Geometry: diameter: 20 mm, 2 degree cone type
Pre shear: 10 (1/s), 60 s
Temperature: constant at 25° C.
Equilibration time (post-pre shear stop time): 60 s
Strain speed dispersion: from 0.05 (1/s) to 5000 (1/s)
Strain speed increase rate: 120 s/decade Moreover, the curable organopolysiloxane composition of the present invention is not limited to the curing system thereof, but is preferably a curable organopolysiloxane which includes at least a hydrosilylation reactive organopolysiloxane and is preferably:

(A) 100 parts by mass of an alkenyl group-containing organopolysiloxane having a viscosity of 10 to 100,000 mPa s at 25° C.;
(B) an organohydrogenpolysiloxane of an amount in which the silicon atom-bonded hydrogen atoms in component (B) are 0.2 to 5 mols with respect to 1 mol of alkenyl groups contained in component (A);
(C) a catalyst for a hydrosilylation reaction in a catalytic amount;
(D) 2.5 to 20.0 parts by mass of a functional filler having an average particle diameter of 0.01 to 10 μm as measured by a laser diffraction/scattering method;
(E) one or more adhesion promoters; and
(F) a hydrosilylation reaction inhibitor;
wherein at least a portion of component (A) or (B) may be a curable organopolysiloxane having silicon atom-bonded aromatic functional groups. In particular, a portion of component (A) is preferably (A1) an alkenyl group-containing organopolysiloxane having a viscosity of 10 to 100,000 mPa s at 25° C. in addition to containing silicon atom-bonded aromatic functional groups within a range of 2.0 to 25.0 mass %. Moreover, in terms of high viscosity and low fluidity in the low strain speed region, component (D) may have at least (D1) a reinforcing filler having an average primary particle diameter within a range of 0.01 to 0.5 μm. Moreover, in particular, in terms of preventing nozzle clogging, component (F) may be a mixture of (F1) an acetylenic hydrosilylation reaction inhibitor and (F2) a cycloalkenylsiloxane based hydrosilylation reaction inhibitor.

Moreover, an object of the present invention is suitably achieved by a single-liquid type curable organopolysiloxane composition, and particularly suitably, by any of the abovementioned single-liquid type curable organopolysiloxane compositions used for pattern formation application. Here, the pattern is preferably a so-called fine pattern, may be an application region of the curable organopolysiloxane composition (the shape of which may be an application region (housed within a frame having vertical and lateral lengths of 1000 μm), a linear region (with a linear width of 1000 μm or less), or a combination thereof) and is particularly preferably a fine pattern in which a plurality of these substantially dotted or linear application regions are formed.

Moreover, an object of the present invention is achieved by a single-liquid type curable organopolysiloxane composition applied by a fine droplet coating apparatus. Here, the fine droplet coating apparatus may be an inkjet application system or a dispenser application system, but is most preferably a jet dispenser.

Similarly, an object of the present invention is achieved by a method for forming a pattern, including applying any of the abovementioned curable organopolysiloxane compositions onto a base material using a fine droplet coating apparatus. Here, the abovementioned pattern preferably contains at least an application region (housed within a frame having vertical and lateral lengths of 1000 μm), a linear region (with a linear width of 1000 μm or less), or a combination thereof, which is applied to the composition using a fine droplet coating apparatus having a nozzle diameter of 1000 μm or less. The pattern is preferably a fine pattern obtained by forming multiple substantially dotted application regions. Moreover, a jet dispenser is particularly preferably used as the fine droplet coating apparatus in the abovementioned pattern formation method.

Moreover, an object of the present invention is solved by an electronic component or precursor thereof including a structure obtained by applying the curable organopolysiloxane composition or a cured product thereof to at least some regions. The region to which the curable organopolysiloxane composition or a cured product thereof is applied is preferably formed for one or more types selected from protection, closing, sealing, and coating of the electronic component or precursor thereof. For example, protection of semiconductor chips, electrodes, or wirings, closing of semiconductor chips and electrodes, sealing of openings and gaps in electronic components, coating of these, etc. are specific applications, such that protection, closing, sealing, and coating using the abovementioned fine patterns is preferable.

Regarding the abovementioned electronic component or precursor thereof, the electronic component may be a semiconductor device, in particular, a MEMS device.

Effects of the Invention

The present invention enables the provision of: a curable organopolysiloxane composition which is single-liquid, enables precision application and fine pattern formation by a fine droplet coating apparatus such as a jet dispenser, has excellent curability and handling workability, has particularly excellent cold resistance of the cured product, and can be used within a wide range of temperature regions; and a method of forming a pattern using the same. Further, an electronic component or a precursor thereof including the composition or a cured product thereof can be provided.

MODE FOR CARRYING OUT THE INVENTION

[Curable Organopolysiloxane Composition]

When shear is applied to the curable organopolysiloxane composition according to the present invention for ejection from a fine droplet coating apparatus, etc., the fluidity of the composition increases and smooth ejection thereof is possible from a nozzle, etc. However, once the composition is ejected from a nozzle, etc. and the composition is opened from the shear at the time of ejection, the composition has macroscopic rheological properties such that the composition has greatly reduced fluidity and becomes highly viscous. That is, while the present composition can be smoothly ejected by a fine droplet coating apparatus, etc., the present composition rapidly loses fluidity from ejection to application on the base material, becomes droplets of a high viscosity, and is prevented from scattering or spreading (bleeding) from the target dotted application region. Further, because the curable organopolysiloxane composition according to the present invention contains a certain amount of silicon atom-bonded aromatic functional groups in the composition, a different molecular sequence derived from aromatic functional groups in the cured product is randomly introduced. As a result, compared with the case in which the main molecular structure of the cured product is a silicon atom-bonded aromatic functional group due to containing little silicon atom-bonded aromatic functional groups or a large amount thereof, changes in the elastic modulus of the cured product are suppressed even at low temperatures such as −70° C., improving cold resistance in addition to improving the reliability and low-temperature durability of the electronic component including the curable organopolysiloxane composition or cured product thereof.

Specifically, the viscosity of the curable organopolysiloxane composition according to the present invention varies depending on the strain speed (1/s) thereof, wherein the viscosity at a strain speed of 1,000 (1/s) is 2.0 Pa s or less, while the viscosity at a strain speed of 0.1 (1/s) is a value of 50.0-fold or more the viscosity at a strain speed 1,000 (1/s). This greater change in the viscosity corresponds to a greater change in the flowability from the high shear region of the composition to the low shear region thereof, with the viscosity at a strain speed of 1,000 (1/s) suitably being a value 75.0-fold or more, preferably 100.0-fold or more the viscosity at a strain speed of 0.1 (1/s).

In particular, in terms of ejection performance and precision application from a fine droplet coating apparatus such as a jet dispenser, etc., the composition preferably has a viscosity of 1.5 Pa s or less at a strain speed of 1,000 (1/s), preferably having a viscosity of a value of 50 Pa s or more at a strain speed of 0.1 (1/s). The smaller the viscosity at a strain speed of 1,000 (1/s), the more easily the composition is ejected from the jet dispenser, etc., preventing problems such as nozzle clogging, such that the viscosity at a strain speed of 1,000 (1/s) may be within a range of 0.30 to 1.50 Pa s or within a range of 0.50 to 1.40 Pa s. In contrast, the higher the viscosity at a strain speed of 0.1 (1/s), the more scattering or spreading out of the target dotted application region is suppressed. Therefore, assuming that the viscosity at a strain speed of 0.1 (1/s) is 50-fold or more of the abovementioned viscosity at a strain speed of 1,000 (1/s), the viscosity may be within a range of 50.0 to 500.0 Pa s, within a range of 55.0 to 300.0 Pa s, or within a range of 55.0 to 275.0.

The abovementioned properties reflect the fact that the curable organopolysiloxane composition according to the present invention is thixotropic. Note that among these properties, the viscosity of the composition in the high shear region can be primarily designed via the selection of the polymer component (organopolysiloxane), while the viscosity of the composition in the low shear region can be primarily designed via the selection of the filler. However, the curable organopolysiloxane composition according to the present invention is not particularly limited to the types of components, curing systems, organopolysiloxanes, and fillers thereof, as long as the abovementioned properties are satisfied, with the desired composition design possible depending on the characteristics of the cured product and the purpose of use thereof.

Further, the curable organopolysiloxane composition according to the present invention contains a certain amount of silicon atom-bonded aromatic functional groups in the composition. As described above, the silicon atom-bonded aromatic functional groups are randomly introduced into the siloxane molecular sequence during curing, such that a siloxane sequence containing silicon atom-bonded aromatic functional groups is mainly formed at a constant ratio in a sequence consisting of dimethylpolysiloxane groups, etc. Therefore, the sequence of molecules becomes moderately heterogeneous, with changes in the elastic modulus of the cured product suppressed even at low temperatures such as −70° C., improving cold resistance in addition to improving the reliability and low-temperature durability of the electronic component including the curable organopolysiloxane composition or cured product thereof. Here, the content of the silicon atom-bonded aromatic functional groups in the composition is within a range of 1.0 to 6.0 mass %, and in particular, the content of the silicon atom-bonded aromatic functional groups with respect to the total amount of the curable organopolysiloxane composition (components (A) to (F) described below), other than organic solvents, etc., is preferably within a range of 1.0 to 6.0 mass %, while the content of the silicon atom-bonded aromatic functional groups in the composition is more preferably within a range of 1.5 to 5.0 mass %, particularly preferably within a range of 2.0 to 4.0 mass %. If the content of the silicon atom-bonded aromatic functional groups in the composition is less than the abovementioned lower limit, the cold resistance of the cured product cannot be sufficiently improved. In particular, at low temperatures such as −70° C., elasticity changes rapidly, causing a deterioration in the reliability and low-temperature durability of the electronic component using the cured product.

The silicon atom-bonded aromatic functional groups are aromatic functional groups which are silicon atom-bonded aryl groups or aralkyl groups and are preferably one or more types of aryl groups selected from phenyl groups, tolyl groups, xylyl groups, and naphthyl groups, with phenyl groups particularly preferable in terms of industrial production. While the means for introducing the silicon atom-bonded aromatic functional groups in the composition is optional, a portion of the curable reactive organopolysiloxane is preferably an organopolysiloxane having silicon atom-bonded aromatic functional groups. In this case, a curable reactive organopolysiloxane containing silicon atom-bonded aromatic functional groups within a range of 2.0 to 25.0 mass % is preferably used.

As described above, the curable organopolysiloxane composition according to the present invention is not particularly limited in the curing system, preferably containing at least one or more curing reactive functional groups of a hydrosilylation reaction, condensation reaction, radical reaction, high energy beam reaction, etc. in the composition. Here, because handling workability and rapid curing are possible, the present composition preferably includes hydrosilylation reactive functional groups, potentially further having condensation reactive functional groups or high energy beam reactive functional groups if desired, with radical reaction by peroxide, etc. capable of being used in combination.

The curable organopolysiloxane composition according to the present invention suitably contains:
(A) 100 parts by mass of an alkenyl group-containing organopolysiloxane having a viscosity of 10 to 100,000 mPa s at 25° C.;
(B) an organohydrogenpolysiloxane of an amount in which the silicon atom-bonded hydrogen atoms in component (B) are 0.2 to 5 mols with respect to 1 mol of alkenyl groups contained in component (A);
(C) a catalyst for a hydrosilylation reaction in a catalytic amount;
(D) 2.5 to 20.0 parts by mass of a functional filler having an average particle diameter of 0.01 to 10 μm as measured by a laser diffraction/scattering method;
(E) one or more adhesion promoters; and
(F) a hydrosilylation reaction inhibitor;
Herein, at least a portion of component (A) or (B) is an organopolysiloxane having silicon atom-bonded aromatic functional groups. The composition may further contain (G) a heat resistance imparting agent.

[(A) Alkenyl Group-Containing Organopolysiloxane]

The alkenyl group-containing organopolysiloxane, which is component (A), is the main agent of the present composition, having a viscosity within a range of 10 to 100,000 mPa s at 25° C. Here, the "viscosity at 25° C." refers to the dynamic viscosity determined by component (A) alone using a rotational viscometer, etc. Moreover, at least a portion of component (A) is preferably (A1) an alkenyl group-containing organopolysiloxane having a viscosity of 10 to 100,000 mPa sat 25° C. and containing silicon atom-bonded aromatic functional groups within a range of 2.0 to 25.0 mass %.

The viscosity of component (A) at 25° C. is preferably within a range of 10 to 100,000 mPa s, more preferably within a range of 10 to 10,000 mPa s. If the viscosity of component (A) is less than 10 mPa s, the viscosity of the composition at a strain speed of 0.1 (1/s) excessively decreases, likely leading to failure to achieve the abovementioned rheological properties. In contrast, if the viscosity of component (A) exceeds 100,000 mPa s at 25° C., it becomes difficult to design a composition having a viscosity of 2.0 Pa s or less at a strain speed of 1,000 (1/s), such that the handling workability and gap filling properties tend to decline.

Component (A) is formed by one or two or more alkenyl group-containing organopolysiloxanes. The molecular structure of such an alkenyl group-containing organopolysiloxane is not particularly limited, with examples thereof including linear, branched, cyclic, three-dimensional network structures, and combinations thereof. Component (A) may consist only of a linear alkenyl group-containing orga- nopolysiloxane or an alkenyl group-containing organopolysiloxane having a branched structure; alternatively, it may be formed from a mixture of a linear alkenyl group-containing organopolysiloxane and an alkenyl group-containing organopolysiloxane having a branched structure. Moreover, exemplary alkenyl groups in the molecule include vinyl groups, allyl groups, butenyl groups, hexenyl groups, etc. Moreover, exemplary organic groups other than alkenyl groups in component (A) include: alkyl groups such as methyl groups, ethyl groups, and propyl groups; aryl groups such as phenyl groups and tolyl groups; and monovalent hydrocarbon groups other than alkenyl groups such as halogenated alkyl groups such as 3,3,3-trifluoropropyl groups. At least a portion of component (A) has silicon atom-bonded aromatic functional groups in addition to the alkenyl groups. In particular, component (A) further has one or more types of aryl groups selected from phenyl groups, tolyl groups, xylyl groups, and naphthyl groups.

Component (A) is particularly suitably a linear alkenyl group-containing organopolysiloxane. In this case, the bonding site of the alkenyl group is not particularly limited and may be the terminal of a molecular chain or may be a form bonded to the side chain via a silicon atom on the polysiloxane forming the main chain. Moreover, alkenyl groups may be contained at both terminals of a molecular chain or alkenyl groups may be contained only at both terminals of a molecular chain.

While not particularly limited thereto, exemplary such components include: a dimethylpolysiloxane blocked with dimethylvinylsiloxy groups at both terminals of a molecular chain; a dimethylsiloxane/methylphenylsiloxane copolymer blocked with dimethylvinylsiloxy groups at both terminals of a molecular chain; a dimethylsiloxane/methylvinylsiloxane copolymer blocked with trimethylsiloxy groups at both terminals of a molecular chain; a dimethylsiloxane/methylvinylsiloxane/methylphenylsiloxane copolymer blocked with trimethylsiloxy groups at both terminals of a molecular chain; a dimethylsiloxane/methylvinylsiloxane copolymer blocked with silanol groups at both terminals of a molecular chain; polymers in which a portion of methyl groups of these polymers are substituted with alkyl groups other than methyl groups such as ethyl groups and propyl groups; polymers in which a portion of vinyl groups of these polymers are substituted with alkenyl groups other than vinyl groups such as allyl groups, butenyl groups, and hexenyl groups; and mixtures of two or more of these polymers. Note that regarding these alkenyl group-containing organopolysiloxanes, in terms of preventing contact failure, etc., low molecular weight siloxane oligomers (octamethyltetrasiloxane (D4) and decamethylpentasiloxane (D5)) are preferably reduced or eliminated.

The organopolysiloxane serving as component (A1) and having silicon atom-bonded aromatic functional groups may be blended within 5 to 50 mass % of the entire component (A) and is one type selected from the group consisting of a dimethylsiloxane/methylphenylsiloxane copolymer blocked with dimethylvinylsiloxy groups at both terminals of a molecular chain and a dimethylsiloxane/methylvinylsiloxane/methylphenylsiloxane copolymer blocked with trimethylsiloxy groups at both terminals of a molecular chain, with an alkenyl group-containing organopolysiloxane (wherein, the content of the silicon atom-bonded phenyl groups in the molecule is 2.0 to 25.0 mass %, more suitably within a range of 3.0 to 15.0 mass %) preferably used as at least a portion of component (A1).

Component (A) of the present invention further has a silicon atom-bonded alkoxysilyl-containing group represented by the general formula:

[Formula 1]

(wherein, $R^1$ is the same or different monovalent hydrocarbon group not having an aliphatic unsaturated bond, $R^2$ is an alkyl group, $R^3$ is the same or different alkylene group, a is an integer of 0 to 2, and p is an integer of 1 to 50)

The organopolysiloxane having these functional groups suppresses thickening of the composition in the uncured state, in addition to having alkoxysilyl groups in the molecule, allowing it to function as a surface treatment agent for component (D). As a result, it may be beneficial in suppressing thickening and oil bleeding of the obtained composition and not impairing handling workability.

Component (A) may be blended alone into the composition, kneaded together with the below-mentioned component (D), and blended into the composition in the form of a masterbatch, etc. The same applies to component (A1) which is a portion of component (A).

[(B) Organohydrogenpolysiloxane]

Component (B) is the main crosslinking agent of the composition according to the present invention, wherein an organohydrogenpolysiloxane having two or more silicon atom-bonded hydrogen atoms in the molecule can be suitably used without particular limitation. Note that in terms of the flexibility of the cured product obtained by curing the composition according to the present invention, the structure of the organohydrogenpolysiloxane and the number (average value) of silicon atom-bonded hydrogen atoms in the molecule may be designed. For example, a linear organohydrogenpolysiloxane having at least two molecular chain side chains may be used as a chain length extender in terms of having excellent flexibility of the obtained organopolysiloxane cured product and excellent releasability from a member in addition to improving repair properties such as repair/reuse. In order to obtain a cured product with high hardness, a large number of silicon atom-bonded hydrogen atom organohydrogenpolysiloxanes may be used as crosslinking agents in the side chain and may be used in combination. Moreover, a portion of component (B) may be an organohydrogenpolysiloxane having, in the molecule, two or more silicon atom-bonded hydrogen atoms along with silicon atom-bonded aromatic functional groups. In particular, when the curable organopolysiloxane composition according to the present invention consists of the above-mentioned components (A) to (F) and component (A) does not contain sufficient silicon atom-bonded aromatic functional groups, component (B) must have sufficient silicon atom-bonded aromatic functional groups for improvements in cold resistance. However, when component (A) includes sufficient silicon atom-bonded aromatic functional groups, component (B) may be an organohydrogenpolysiloxane which does not contain silicon atom-bonded aromatic functional groups.

[Amount of the Organohydrogenpolysiloxane (Crosslinking Agent) in the Composition]

In the composition according to the present invention, regarding component (B), silicon atom-bonded hydrogen atoms in the component (B) with respect to at least one mole of alkenyl groups contained in component (A) may be within a range of 0.2 to 50 mols, may be within a range of 0.2 to 30 mols, or may be within a range of 0.2 to 10 to 0.2 to 5 mols.

Exemplary components (B) include: a methylhydrogensiloxane/dimethylsiloxane copolymer blocked with trimethylsiloxy groups at both terminals of a molecular chain; a methylhydrogensiloxane/dimethylsiloxane copolymer blocked with dimethylhydrogensiloxy groups at both terminals of a molecular chain; a methylhydrogenpolysiloxane blocked with trimethylsiloxy groups at both terminals of a molecular chain; a dimethylpolysiloxane blocked with dimethylhydrogensiloxy groups at both terminals of a molecular chain; a methylhydrogensiloxy group-containing siloxane resin; a cyclic methylhydrogensiloxane/dimethylsiloxane copolymer; and a cyclic methylhydrogenpolysiloxane. Note that these examples are non-limiting, with some methyl groups capable of being substituted with C2 or more alkyl groups, phenyl groups, hydroxyl groups, alkoxy groups, halogen atom-substituted alkyl groups, etc.

While the viscosity of component (B1) at 25° C. is not particularly limited, it is preferably within a range of 1 to 500 mPa s; and in terms of preventing contact failure, etc., the low molecular weight siloxane oligomer (octamethyltetrasiloxane (D4) and decamethylpentasiloxane (D5)) is preferably reduced or eliminated.

[(C) Hydrosilylation Reaction Catalyst]

As the hydrosilylation reaction catalyst, platinum-based catalysts, rhodium-based catalysts, and palladium-based catalysts are exemplified, with platinum-based catalysts being preferable because the curing of the present composition can be remarkably accelerated. Exemplary platinum-based catalysts include platinum fine powder, chloroplatinic acid, an alcohol solution of chloroplatinic acid, a platinum-alkenyl siloxane complex, a platinum-olefin complex, a platinum-carbonyl complex, and a catalyst in which these platinum-based catalysts are dispersed or encapsulated with a thermoplastic resin such as silicone resin, polycarbonate resin, acrylic resin or the like, with a platinum-alkenyl siloxane complex particularly preferable. Exemplary alkenylsiloxanes include: 1,3-divinyl-1,1,3,3-tetramethyldisiloxane; 1,3,5,7-tetramethyl-1,3,5,7-tetravinylcyclotetrasiloxane; alkenyl siloxanes obtained by substituting a portion of methyl groups of the alkenylsiloxanes with an ethyl group, a phenyl group, or the like; and alkenylsiloxanes obtained by substituting a portion of vinyl groups of these alkenylsiloxanes with an allyl group, a hexenyl group, or the like. In particular, 1,3-divinyl-1,1,3,3-tetramethyldisiloxane is preferable because the platinum-alkenyl siloxane complex has good stability. In addition, in terms of improving the handleability as well as the pot life of the composition, a platinum containing hydrosilylation reaction catalyst in fine particles dispersed and encapsulated with thermoplastic resin may be used. As the catalyst for promoting the hydrosilylation reaction, a non-platinum based metal catalyst such as iron, ruthenium, iron/cobalt, or the like may be used.

The amount of the hydrosilylation reaction catalyst to be added is a catalytic amount and preferably an amount in which the metal atom is within a range of 0.01 to 500 ppm, an amount within a range of 0.01 to 100 ppm, or an amount within a range of 0.01 to 50 ppm in terms of mass units with regard to component (A).

[(D) Functional Filler]

The curable organopolysiloxane composition according to the present invention preferably further contains a functional filler (D). This functional filler is preferably one or more selected from a reinforcing filler, a thermally conductive filler, and a conductive filler and preferably contains a reinforcing filler particularly when the present invention composition is used in the application of a protectant or adhesive. While not particularly limited thereto, the particle diameter of fine powder of the functional filler is preferably, for example, within a range of 0.01 μm to 10 μm at the median diameter (hereinafter, simply referred to as the "average particle diameter") based on the laser diffraction/scattering type particle size distribution measurement. Because the composition according to the present invention is preferably precisely applied to a region having a diameter of 1000 μm or less, the composition preferably does not contain a functional filler having a large particle diameter. Note that, while the average particle diameter includes the concept of both the average primary particle diameter and the secondary particle diameter depending on the type of functional filler, the average primary particle diameter is preferably within the abovementioned range, particularly in the reinforcing filler.

The reinforcing filler is a component which imparts mechanical strength to a silicone rubber cured product obtained by curing the present composition, improving the performance as a protectant or adhesive. Exemplary reinforcing fillers may include, for example, inorganic fillers such as fumed silica fine powder, precipitated silica fine powder, burned silica fine powder, fumed titanium dioxide fine powder, quartz fine powder, calcium carbonate fine powder, diatomaceous earth fine powder, aluminum oxide fine powder, aluminum hydroxide fine powder, zinc oxide fine powder, zinc carbonate fine powder, and carbon black, with these inorganic fillers capable of containing inorganic fillers surface treated with treatment agents including organoalkoxysilanes such as a methyltrimethoxysilane, organohalosilanes such as a trimethylchlorosilane, organosilazanes such as a hexamethyldisilazane, and siloxane oligomers such as a dimethylsiloxane oligomer blocked by an α,ω-silanol group, a methylphenylsiloxane oligomer blocked by an α,ω-silanol group, and a methylvinylsiloxane oligomer blocked by an α,ω-silanol group. In particular, by treating the surface of component (D) in advance with an organopolysiloxane of a low degree of polymerization having a silanol group at both terminals of a molecular chain (suitably, a dimethylpolysiloxane blocked with an α,ω-silanol group not having reactive functional groups other than this terminal silanol group in molecules), excellent initial adhesiveness, adhesive durability, and adhesive strength at low temperatures for a short period of time can be achieved, and further sufficient usable time (storage period and handling operation time) can be ensured. In particular, in terms of technical curing of the present invention, (D1) a reinforcing filler subjected to any of the abovementioned surface treatments and preferably having an average primary particle diameter within a range of 0.01 to 0.5 μm, in particular, a silica fine powder treated with organosilazane, etc. and having an average primary particle diameter within a range of 0.01 to 0.30 μm is suitable.

While not limited thereto, the content of the reinforcing filler, with respect to 100 parts by mass of the organopolysiloxane, is preferably within a range of 0.1 to 20.0 parts by mass, particularly preferably within a range of 1.0 to 15.0 parts by mass and 2.0 to 10.0 parts by mass, in terms of improving the viscosity at a strain speed of 0.1 (1/s).

Moreover, in view of the blending properties of component (D), a portion of or the entire component (D) may be kneaded into the abovementioned component (A) in advance and may be blended into the composition in the form of a masterbatch containing component (D), component (A), and a surface treatment agent of component (D). Note that a portion of component (A) is preferably an organopolysiloxane (having silicon-atom bonded hydrogen atoms) which is component (A1).

The thermally conductive filler or the electrically conductive filler is a component which imparts thermal conductivity or electrical conductivity to the silicone rubber cured product obtained by curing the present composition as desired and is exemplified by a metal fine powder such as gold, silver, nickel, copper, etc., a fine powder obtained by depositing or plating a metal such as gold, silver, nickel, copper, etc. on the surface of a fine powder such as ceramic, glass, quartz, organic resin, etc., a metal compound such as aluminum oxide, aluminum nitride, zinc oxide, etc., and a mixture of two or more of these. Particularly preferred are silver powder, aluminum powder, aluminum oxide powder, zinc oxide powder, aluminum nitride powder or graphite. When electrical insulation is required for the present composition, a metal oxide powder or a metal nitride powder is preferable, and in particular, aluminum oxide powder, zinc oxide powder, or aluminum nitride powder is preferable.

[(E) Adhesion Promoter]

The composition according to the present invention preferably includes (E) one or more adhesion promoters, specifically preferably including one or more adhesion promoters selected from the following component components (e1) to (e4). By containing these components, the composition has excellent initial adhesiveness to an uncleaned aluminum die cast and resin material. Herein, even during use under harsh environments, the adhesive durability and adhesive strength are further improved, while the reliability/durability of electric/electronic parts can be maintained for extended periods of time.

(e1) a reaction mixture between an amino group-containing organoalkoxysilane and an epoxy group-containing organoalkoxysilane;

(e2) an organic compound having at least two alkoxysilyl groups per one molecule, in addition to containing bonds other than a silicon-oxygen bond between these silyl groups;

(e3) an epoxy group-containing silane represented by general formula:

(wherein, Ra represents an organic group containing a monovalent epoxy group, Rb represents an alkyl group having a carbon number of 1 to 6, or a hydrogen atom. n represents a number within a range of 1 to 3), or a partially hydrolyzed condensate thereof; and (e4) a reaction mixture of a vinyl group-containing siloxane oligomer (including a chain or cyclic structure) and an epoxy group-containing trialkoxysilane Component (e1) is a reaction mixture between an amino group-containing organoalkoxysilane and an epoxy group-containing organoalkoxysilane. Such component (e1) is a component for imparting initial adhesiveness to various base materials it contacts during curing, in addition to imparting adhesiveness at low temperatures particularly to an uncleaned adherend. Moreover, some curing systems of a curable composition obtained by blending this adhesion promoter may act as a crosslinking agent. Such a reaction mixture is disclosed in JP 52-8854 B and JP 10-195085 A.

Exemplary alkoxysilanes having an amino group-containing organic group forming such component (e1) include an aminomethyltriethoxysilane, 3-aminopropyltrimethoxysilane, 3-aminopropyltriethoxysilane, 3-aminopropylmethyldimethoxysilane, N-(2-aminoethyl)aminomethyltributoxysilane, N-(2-aminoethyl)-3-aminopropyltrimethoxysilane, N-(2-aminoethyl)-3-aminopropylmethyldimethoxysilane, and 3-anilinopropyltriethoxysilane.

Moreover, exemplary epoxy groups containing organoalkoxysilanes may include 3-glycidoxyprolyltrimethoxysilane, 3-glycidoxypropylmethyldimethoxysilane, 2-(3,4-epoxy cyclohexyl)ethyltrimethoxysilane, and 2-(3,4-epoxy cyclohexyl)ethylmethyldimethoxysilane.

The ratio of the alkoxysilane having an amino group containing organic group to the alkoxysilane having an epoxy group containing organic group is, in terms of the molar ratio, preferably within the range of (1:1.5) to (1:5), particularly preferably within the range of (1:2) to (1:4). This component (e1) can be easily synthesized by mixing alkoxysilane having an amino group containing organic group and alkoxysilane having an epoxy group containing organic group as mentioned above to cause them to react at room temperature or under heating.

In particular, when an alkoxysilane having an amino group containing organic group is reacted with an alkoxysilane having an epoxy group containing organic group by the method described in JP 10-195085 A, the present invention particularly preferably contains a carbasilatrane derivative obtained by cyclizing and represented by the general formula:

[Formula 2]

{wherein, $R^1$ is an alkyl group or an alkoxy group, and $R^2$ is the same or different group selected from the group consisting of groups represented by the general formula:

[Formula 3]

(wherein, $R^4$ is an alkylene group or alkyleneoxyalkylene group, $R^5$ is a monovalent hydrocarbon group, $R^6$ is an alkyl group, $R^7$ is an alkylene group, $R^8$ is an alkyl group, alkenyl group, or acyl group, and a is 0, 1, or 2.)

$R^3$ is the same or different hydrogen atom or alkyl group.}

Exemplary carbasilatrane derivatives may include a silatrane derivative having an alkenyl group and silicon atom-bonded alkoxy group per one molecule represented by the following structure.

[Formula 4]

Component (e2) is an organic compound having at least two alkoxysilyl groups per one molecule, in addition to containing bonds other than a silicon-oxygen bond between these silyl groups, and serves to independently improve initial adhesiveness and improve the adhesive durability to a cured product including this adhesion promoter under harsh conditions particularly when used in combination with components (e1) and (e3).

In particular, component (e2) is suitably a disilaalkane compound represented by the below-mentioned general formula:

[Formula 5]

(wherein, $R^C$ is a substituted or unsubstituted alkylene group having a carbon number of 2 to 20, $R^D$ is each independently an alkyl group or alkoxyalkyl group, $R^E$ is each independently a monovalent hydrocarbon group, and b is each independently 0 or 1.) Such component (e2) is commercially available as a reagent or product in various compounds and can be synthesized using a well-known method such as the Grignard reaction or hydrosilylation reaction. For example, component (g2) can be synthesized via a well-known method by the hydrosilylation reaction between diene and trialkoxysilane or organodialkoxysilane.

In the formula, $R^E$ is a monovalent hydrocarbon group including: an alkyl group such as a methyl group, ethyl group, and propyl group; an alkenyl group such as a vinyl group or allyl group; and an aryl group such as a phenyl group, with a lower alkyl group preferable. $R^D$ is an alkyl group such as a methyl group, ethyl group, and propyl group, or an alkoxyalkyl group such as a methoxyethyl group, preferably having a carbon number of 4 or less. $R^C$ is a substituted or unsubstituted alkylene group, with a linear or branched alkylene group used without limitation, and may be a mixture thereof. In terms of improving adhesiveness, a linear and/or branched alkylene group having a carbon number of 2 to 20 is preferable, with a linear and/or branched alkylene having a carbon number of 5 to 10, particularly hexylene having a carbon number of 6, preferable. The unsubstituted alkylene group may be a butylene group, pentylene group, hexylene group, heptylene group, octylene group, nonylene group, decylene group, or a branched structure thereof, with the hydrogen atom capable of being substituted with a methyl group, ethyl group, propyl group, butyl group, cyclopentyl group, cyclohexyl group, vinyl group, allyl group, 3,3,3-trifluoropropyl group, or 3-chloropropyl group.

Specific examples of component (e2) include bis(trimethoxysilyl)ethane, 1,2-bis(trimethoxysilyl)ethane, 1,2-bis(triethoxysilyl)ethane, 1,2-bis(methyldimethoxysilyl)ethane, 1,2-bis(methyldiethoxysilyl)ethane, 1,1-bis(trimethoxysilyl)ethane, 1,4-bis(trimethoxysilyl)butane, 1,4-bis(triethoxysilyl)butane, 1-methyldimethoxysilyl-4-trimethoxysilylbutane, 1-methyldiethoxysilyl-4-triethoxysilylbutane, 1,4-bis(methyldimethoxysilyl)butane, 1,4-bis(methyldiethoxysilyl)butane, 1,5-bis(trimethoxysilyl)pentane, 1,5-bis(triethoxysilyl)pentane, 1,4-bis(trimethoxysilyl)pentane, 1,4-bis(triethoxysilyl)pentane, 1-methyldimethoxysilyl-5-trimethoxysilylpentane, 1-methyldiethoxysily-5-triethoxysilylpentane, 1,5-bis(methyldimethoxysilyl)pentane, 1,5-bis(methyldiethoxysilyl)pentane, 1,6-bis(trimethoxysilyl)hexane, 1,6-bis(triethoxysilyl)hexane, 1,4-bis(trimethoxysilyl)hexane, 1,5-bis(trimethoxysilyl)hexane, 2,5-bis(trimethoxysilyl)hexane, 1-methyldimethoxysilyl-6-trimethoxysilylhexane, 1-phenyldiethoxysilyl-6-triethoxysilylhexane, 1,6-bis(methyldimethoxysilyl)hexane, 1,7-bis(trimethoxysilyl)heptane, 2,5-bis(trimethoxysilyl)heptane, 2,6-bis(trimethoxysilyl)heptane, 1,8-bis(trimethoxysilyl)octane, 2,5-bis(trimethoxysilyl)octane, 2,7-bis(trimethoxysilyl)octane, 1,9-bis(trimethoxysilyl)nonane, 2,7-bis(trimethoxysilyl)nonane, 1,10-bis(trimethoxysilyl)decane, and 3,8-bis(trimethoxysilyl)decane. These can be used independently or as a mixture of two or more types thereof. In the present invention, 1,6-bis(trimethoxysilyl)hexane, 1,6-bis(triethoxysilyl)hexane, 1,4-bis(trimethoxysilyl)hexane, 1,5-bis(trimethoxysilyl)hexane, 2,5-bis(trimethoxysilyl)hexane, 1-methyldimethoxysilyl-6-trimethoxysilylhexane, 1-phenyldiethoxysilyl-6-triethoxysilylhexane, and 1,6-bis(methyldimethoxysilyl)hexane can be suitably exemplified.

Component (e3) is an epoxy group-containing silane represented by the general formula:

(wherein, $R^a$ represents an organic group containing a monovalent epoxy group, $R^b$ represents an alkyl group having a carbon number of 1 to 6, or a hydrogen atom. n represents a number within a range of 1 to 3), or a partially hydrolyzed condensate thereof, independently improves initial adhesiveness, and particularly enhances the adhesive durability under harsh conditions such as salt water immersion in a cured product including this adhesion promoter in combination with said components (e1) and (e2). Note that component (e3) is one of the constituent components of component (e1), (wherein, the mass ratio with reactant component (e1) (typically, a carbasilatrane derivative serving as a cyclized reactant) within the specific range is necessary in terms of the technical effects of the invention) and must be added as a component separate from component (e1).

Exemplary epoxy group containing silanes may include 3-glycidoxyprolyltrimethoxysilane, 3-glycidoxypropylmethyldimethoxysilane, 2-(3,4-epoxy cyclohexyl)ethyltrimethoxysilane, and 2-(3,4-epoxy cyclohexyl)ethylmethyldimethoxysilane.

Component (e4) is an adhesion promoter having epoxysiloxy units (represented by $R^1SiO_{3/2}$ (R1 is an epoxy group)) and vinylsiloxy units, and is a component described in JP 01-085224 A. Such adhesion promoters can be obtained by subjecting an epoxy group-containing trialkoxysilane (such as 3-glycidoxyprolyltrimethoxysilane) with a chain vinyl group-containing siloxane oligomer (having hydroxyl groups (silanol groups) at both terminals of a molecular chain) or a cyclic vinyl group-containing siloxane oligomer (such as a tetramethyl tetravinyl cyclotetrasiloxane) to a hydrolysis reaction in the presence of an alkali compound (see the abovementioned Patent Documents).

While the blended amount of the adhesion promoter (E) is not particularly limited, the mass of the adhesion promoter (E), which is a sum of the abovementioned components (e1) to (e4), may be within a range of 0.1 to 20 mass % in the curable organopolysiloxane composition, wherein the adhesion promoter preferably contains 0.3 to 10 mass %, particularly preferably 0.5 to 5.0 mass %.

[(F) Hydrosilylation Reaction Inhibitor]

The composition according to the present invention preferably further contains a hydrosilylation reaction inhibitor in terms of the handling workability thereof. The hydrosilylation reaction inhibitor is a component for suppressing the hydrosilylation reaction of the curable organopolysiloxane composition according to the present invention, with specific examples thereof including reaction inhibitors such as acetylenic ones (such as ethynyl cyclohexanol), amine based ones, carboxylic acid ester based ones, and phosphite ester based ones. The addition amount of the reaction inhibitor is typically 0.001 to 5 mass % of the total silicone composition. Acetylenic compounds such as 3-methyl-1-butyn-3-ol, 3,5-dimethyl-1-hexyne-3-ol, and 3-phenyl-1-butyne-3-ol, enyne compounds such as 3-methyl-3-pentene-1-yne and 3,5-dimethyl-3-hexene-1-yne, cycloalkenylsiloxanes such as 1,3,5,7-tetramethyl-1,3,5,7-tetravinylcyclotetrasiloxane, and 1,3,5,7-tetramethyl-1,3,5,7-tetrahexenylcyclotetrasiloxane, and triazole compounds such as benzotriazole can be particularly used without any limitation in order to improve the handling workability of silicone compositions.

In particular, the curable organopolysiloxane composition according to the present invention is suitable for use in a form applied by precision application from a nozzle having a diameter of 1000 μm or less using a fine droplet coating apparatus such as a jet dispenser. In terms of controlling the curing reaction even under high shear conditions and suppressing nozzle clogging, etc., component (F) may be a mixture of (F1) an acetylenic hydrosilylation reaction inhibitor and (F2) a cycloalkenylsiloxane based hydrosilylation reaction inhibitor, in particular, a combination of ethynylcyclohexanol, 1,3,5,7-tetramethyl-1,3,5,7-tetravinylcyclotetrasiloxane, and 1,3,5,7-tetramethyl-1,3,5,7-tetrahexenylcyclotetrasiloxane is preferable.

[(G) Heat Resistance Imparting Agent]

The composition according to the present invention contains the abovementioned components (A) to (F), in addition to other optional crosslinking agents and hydrosilylation reaction inhibitors. However, in terms of improving the heat resistance of the curable organopolysiloxane composition and the cured product thereof, the composition preferably further contains (G) a heat resistant imparting agent. Component (G) is not particularly limited as long as it is capable of imparting heat resistance to the composition according to the present invention and the cured product thereof, with examples thereof including: metal oxides such as iron oxide, titanium oxide, cerium oxide, magnesium oxide, aluminum oxide, and zinc oxide; metal hydroxides such as cerium hydroxide; phthalocyanine compounds; carbon black; cerium silanolate; cerium fatty acid salts; reaction products of an organopolysiloxane with a cerium carboxylic acid salt; etc. Particularly suitably, component (G) is a phthalocyanine compound, for example, an additive selected from the group consisting of a metal-free phthalocyanine compound and a metal-containing phthalocyanine compound disclosed in JP 2014-503680 W is suitably used, with copper phthalocyanine compounds particularly suitable among the metal-containing phthalocyanine compounds. One example of the most suitable and non-limiting heat resistance imparting agent is 29 H,31H-phthalocyaninato(2-)-N29,N30,N31,N32 copper. Such phthalocyanine compounds are commercially available, for example, Stan-tone (trademark) 40SP03 from PolyOne Corporation (Avon Lake, Ohio, USA.)

The blended amount of such component (G) may be within a range of 0.01 to 5.0% by mass of the total composition, or may be within a range of 0.05 to 0.2 mass % and 0.07 to 0.1 mass % thereof.

[Other Additives]

In addition to the abovementioned components, optional components may be added to the curable organopolysiloxane composition according to the present invention so long as the object of the present invention is not impaired. Exemplary optional components may include: trifunctional alkoxysilanes such as methyltrimethoxysilane, methyltriethoxysilane, ethyltrimethoxysilane, ethyltriethoxysilane, vinyltrimethoxysilane, and phenyltrimethoxysilane; tetrafunctional alkoxysilanes such as tetramethoxysilane and tetraethoxysilane; and partial hydrolysis condensates thereof. Further, exemplary present compositions include: organic solvents such as toluene, xylene, acetone, methyl ethyl ketone, methyl isobutyl ketone, hexane, and heptane; organopolysiloxanes, cold resistance imparting agents, flame retardance imparting agents, pigments, and dyes, which do not contain silicon atom-bonded hydrogen atoms or silicon atom-bonded alkenyl groups; etc. Moreover, the curable organopolysiloxane composition of the present invention can, if desired, include one or more types of antistatic agents including other known adhesion imparting agents, cationic surfactants, anionic surfactants, or nonionic surfactants, dielectric fillers, electrically conductive fillers, mold release components, thixotropy imparting agents, antifungal agents, etc.

[Method for Manufacturing the Composition]

The curable organopolysiloxane composition according to the present invention can be prepared by uniformly mixing each of the abovementioned components, for example, by premixing a portion of component (A) with component (D) to form a masterbatch, then mixing other optional components such as remaining components (A), components (B), (C), (E), (F), and (G). However, the order of addition during manufacture of the present composition is not limited thereto.

Although the method for mixing each component may be a conventionally known method and is not particularly limited, a uniform mixture is generally made by simple stirring. Therefore, mixing using a mixing apparatus is preferable. While not particularly limited thereto, exemplary such mixing apparatuses may include a single or twin shaft continuous mixer, two rolls, Ross mixer, Hobart mixer, dental mixer, planetary mixer, kneader mixer, Henschel mixer, etc.

[Composition Form and Package]

The curable organopolysiloxane composition according to the present invention is preferably used as a one-component (including single-liquid) composition, with each component of the composition capable of being placed in a single storage container and used by a fine droplet coating apparatus such as a jet dispenser. Note that while not particularly limited thereto, these packages can be selected as desired depending on the curing method, application means, and application object as described below.

[Application and Pattern Formation]

A method for manufacturing a pattern includes preparing a substrate. The base material may be a solid substrate with undulations/irregularities associated with a substantially flat or circuit arrangement. While not particularly limited thereto, exemplary materials include metals such as aluminum, iron, zinc, copper, and magnesium alloys, plastics such as epoxy resins, acrylic resins, ABS, PA, PBT, PC, PPS, and SPS, and glasses. While not particularly limited thereto, the thickness of the base material may be 0.1 to 10 mm.

[Application Method]

The method for applying the curable polyorganosiloxane composition is not particularly limited; however, in order to take advantage of the present invention, the curable polyorganosiloxane composition is preferably applied onto the base material using a fine droplet coating apparatus.

While the fine droplet coating apparatus capable of being used in the present invention is an inkjet application system or a dispenser application system, the curable polyorganosiloxane composition according to the present invention can be particularly preferably used for application by a fine droplet coating apparatus using a dispenser application system. The dispenser application system includes an air type, valve type, screw type, volume type, or jet type dispenser, with a jet dispenser preferable in terms of fine pattern application. Further, the jet dispenser includes an air valve system, a solenoid system, and a piezo system. Thereamong, a piezo system is preferable in terms of applying a fine pattern. The size of the droplets of the curable polyorganosiloxane composition to be ejected by the fine droplet ejection apparatus and the drop weight of the one-shot can be designed by selecting the fine droplet coating apparatus and the ejection conditions. The drop weight can be 50 μg or less, 30 μg or less, or 25 μg or less, and depending on the apparatus, it can be designed even if the drop weight is less than 10 μg.

The use of these fine droplet coating apparatuses enables precise control of the amount of application of the curable part and the landing position of the droplets of the curable part, enabling the formation of a high density pattern (that is, a cured product of the curable polyorganosiloxane composition).

These fine droplet coating apparatuses commonly include nozzles for dispensing compositions in droplets. While the application nozzle diameter is not particularly limited, the nozzle diameter must be 1000 μm or less in order to perform a precise dotted application and is preferably 50 to 200 μm, particularly preferably 100 to 150 μm. Because the fluidity of the curable polyorganosiloxane composition according to the present invention is improved during a high shear, if the application nozzle diameter is 50 μm or more, the curable polyorganosiloxane composition can stably carry out droplet coating. In contrast, if the coating nozzle diameter is 200 μm or less, a larger amount of droplet application can advantageously be carried out in a short period of time. Moreover, apparently, the droplets can be precisely applied in order to rapidly decrease the fluidity from the moment of ejection and thicken.

While not particularly limited thereto, the dispensing frequency is preferably 1 ms/shot to 10 s/shot, and preferably 1 ms/shot to 10 ms/shot. While not particularly limited thereto, the movement speed of the nozzle is preferably 1 to 300 mm/sec, more preferably 50 to 100 mm/sec. However, the dispensing frequency and movement speed of the nozzles can be appropriately set depending on the apparatus and purpose thereof.

[Pattern Formation]

The application of the curable polyorganosiloxane composition according to the present invention on a base material using the abovementioned fine droplet coating apparatus makes it possible to form a pattern including fine dotted or linear application regions on the base material.

Because each of the application regions forming the pattern is dotted or linear and is a fine region, it is preferably an application region (housed within a frame having vertical and lateral lengths of 1000 μm) (in particular, a substantially circular region housed within a frame having a diameter of 1000 μm or less) or a linear region (with a linear width of 1000 μm or less). Because the curable polyorganosiloxane composition according to the present invention is particularly suitable for forming a precise pattern, each application region may be a pattern formed by a substantially circular region (housed within a frame having a diameter of 800 μm or less), a linear region (with a linear width of 800 μm or less), or a combination thereof. Moreover, the application region can be designed so as to have a pattern configured by a substantially circular region (housed within a frame of 5 to 500 μm), a linear region (with a linear width of 5 to 500 μm), or a combination thereof. Moreover, two or more of these fine application regions forming the pattern are preferably present on the same base material, wherein a pattern may be formed in which multiple fine application regions are distributed at constant intervals on the base material. Note that while the interval between the application regions can be optionally designed, it may be designed to be an interval of 5.0 mm or less or an interval within a range of 0.5 to 4.5 mm.

Each application region forming the pattern is formed from droplets ejected from a fine droplet coating apparatus, with the thickness thereof not particularly limited, and can be appropriately designed according to the type and application of the fine droplet coating apparatus such as a jet dispenser. For example, the application thickness per drop (one shot) of droplets may be within a range of 1 to 1000 μm, more preferably 1 to 500 μm, and particularly preferably 1 to 300 μm.

Further, the curable polyorganosiloxane composition according to the present invention apparently advantageously exhibits the behavior in which ejected droplets rapidly lose their fluidity and thicken, thereby tending not to cause scattering and bleeding (spreading) even if precisely applied in multiple layers in the same application region, allowing the application thickness of the composition to be easily adjusted by multilayering. For example, a continuous shot at one point of the application region enables precise formation of a point where the curable organopolysiloxane is applied in multiple layers (a physically raised application region in appearance).

[Applications of the Present Composition and Pattern]

The present composition is useful for manufacturing an electronic component, an image display apparatus, etc. including the abovementioned pattern, and can be used in a method for forming a dam material in the manufacture of an electronic component, etc. The dam material is used to form a frame in a display part or protective part of an electronic component or image display apparatus, such that the application of a sealing agent within the frame can prevent the sealing agent from flowing out of the display part, etc. Here, the curable polyorganosiloxane composition according to the present invention is a single-liquid composition which advantageously improves the yield and production efficiency in industrial production of these electronic components, image display apparatuses, etc. because the composition thereof is selected as a cured system containing a hydrosilylation reaction so as to easily form a cured product in a short period of time.

[Electrical/Electronic Equipment]

The curable organopolysiloxane composition applied to the abovementioned region is cured by means such as heating to form a cured product. The purpose of applying the curable organopolysiloxane composition or a cured product thereof is optional; however, in the semiconductor member, the curable organopolysiloxane composition or the cured product is preferably formed for one or more purposes selected from protection, closing, sealing, and coating of the electronic component or precursor thereof. For example, protection of semiconductor chips, electrodes, or wirings, closing of semiconductor chips and electrodes, sealing of openings and gaps in electronic components, coating of these, etc. are specific applications, so protection, closing, sealing, and coating using the abovementioned fine patterns is preferable. Fine patterns consisting of the cured product on the base material are widely available for industrial production of electronic components, image display apparatuses, MEMS devices, etc. The cured product can be used in a wide range of temperatures from −70° C. to room temperature. In particular, even when the cured product is used at a low temperature such as −70° C., the elasticity of the cured product does not change greatly, giving the cured product excellent cold resistance. If it is used for these electronic components, etc., the reliability and low-temperature durability thereof can be advantageously further improved.

[Curability]

The curable organopolysiloxane composition according to the present invention is suitably cured by a hydrosilylation reaction to form an organopolysiloxane cured product. While not particularly limited thereto, the temperature conditions for curing the hydrosilylation curing type silicone composition are normally within a range of 20° C. to 200° C., more preferably within a range of 20 to 180° C. If desired, curing may be carried out at high temperatures in a short period of time, so the cured product is easily formed in a short period of time. Therefore, the yield and production efficiency in industrial production of these electronic components, image display apparatuses, MEMS devices, etc. can be advantageously improved. However, if desired, the composition may be cured at a low temperature such as room temperature over a long period of time (for example, several hours to several days) and is not particularly limited.

The curable organopolysiloxane composition according to the present invention can form a fine pattern (consisting of the cured product) on the base material by forming a pattern on the base material and then curing it under the desired curing conditions and is widely available for industrial production of electronic components, image display apparatuses, etc.

[Application to an Electronic Component or a Precursor Thereof]

The curable organopolysiloxane composition according to the present invention can provide an electronic component or precursor thereof with a structure in which the composition or cured product thereof is applied by applying the curable organopolysiloxane composition according to the present invention to at least some regions. That is, the electronic component or precursor thereof according to the present invention must be applied to at least some regions of the abovementioned curable polyorganosiloxane composition, wherein the applied region particularly preferably forms the pattern.

The electronic component or precursor thereof may be a known semiconductor device or precursor thereof such as a diode, transistor, thyristor, monolithic IC, hybrid IC, LSI, or VLSI, and may particularly be a MEMS device or a precursor thereof. Here, MEMS devices are collectively referred to as semiconductor devices formed using a semiconductor micro machining technique, commonly referred to as Micro Electro Mechanical Systems, and may be an inertial sensor (such as an acceleration sensor or angular velocity sensor including an MEMS chip), an image display apparatus, etc. Moreover, a precursor of a semiconductor device, etc. is a general term for an uncompleted electronic component prior to the completion thereof as a semiconductor device by die bonding of a chip, etc. by subsequent wiring, chip placement, heating, etc., and is a concept which includes general members for electronic components (circulated in the state before finishing such as wiring or chip mounting and then exported and imported).

[Method for Manufacturing an Electronic Component or a Precursor Thereof]

The electronic component or precursor thereof according to the present invention can be obtained via a method for manufacturing an electronic component or precursor thereof, the method including at least the step of applying the abovementioned curable organopolysiloxane composition using a fine droplet coating apparatus. The application conditions, application regions, etc. are as described above. In particular, a pattern composition (in which the region (where the curable organopolysiloxane is applied) is formed by a substantially circular region (housed within a frame with a diameter of 500 μm or less), a linear region (with a linear width of 500 μm or less), or a combination thereof) may have the abovementioned pattern, wherein the fine droplet coating apparatus is particularly preferably a jet dispenser including an ejection port with a nozzle diameter of 50 to 200 μm. Moreover, needless to say, if desired, the method for manufacturing the electronic component or precursor thereof according to the present invention may include, in addition to the abovementioned steps, the step of forming a protection film of the wafer, the step of processing wiring on the semiconductor base material, the step of connecting the chip and the electrode, the step of the polishing process, the step of sealing some or all, etc. at the desired timing.

[Specific Examples of Electrical/Electronic Equipment]

The electronic component or precursor thereof according to the present invention may be a known semiconductor device or precursor thereof such as a diode, transistor, thyristor, monolithic IC, hybrid IC, LSI, or VLSI, and may particularly be a MEMS device or a precursor thereof. Here, MEMS devices are collectively referred to as semiconductor devices formed using a semiconductor micro machining technique commonly referred to as Micro Electro Mechanical Systems, and may be an inertial sensor (such as an acceleration sensor or angular velocity sensor including an MEMS chip), a magnetic sensor, a pressure sensor, a microphone, an environmental sensor (of gas, humidity, particles, etc.), an image sensor, actuators using the MEMS technique (for example, optical system actuators such as autofocuses or micromirrors), a wireless communication component, a microspeaker, an image display apparatus, etc. Moreover, a precursor of a semiconductor device, etc. is a general term for an uncompleted electronic component prior to the completion thereof as a semiconductor device by die bonding of a chip, etc. by subsequent wiring, chip placement, heating, etc. and is a concept which includes general members for electronic components (circulated in the state before finishing such as wiring or chip mounting and then exported and imported). The cured product obtained by curing the curable organopolysiloxane composition according to the present invention can be used in a wide range of temperatures from −70° C. to room temperature. In particular, even when the cured product is used at a low temperature such as −70° C., the elasticity of the cured product does not change greatly, giving cured products such as these electronics excellent cold resistance. Upon use for electronic equipment, the reliability and low temperature durability can be advantageously further improved.

EXAMPLES

The present invention will be described below by way of examples; however, the present invention is not limited thereto. In Examples 1 and 2 and Comparative Examples 1 and 2 shown below, the following compounds or compositions were used as raw materials.

<Components of the Curable Organopolysiloxane Composition>

A1: a linear polydimethylsiloxane blocked with dimethylvinyl groups at both terminals, having a viscosity of 60 mPa s at 20° C. (vinyl group content=1.5 mass %)

A2: a linear polydimethylsiloxane blocked with dimethylvinyl groups at both terminals, having a viscosity of 400 mPa s at 20° C. (vinyl group content=0.44 mass %)

A3: a linear polydimethylsiloxane blocked with dimethylvinyl groups at both terminals, having a viscosity of 2000 mPa s at 20° C. (vinyl group content=0.23 mass %)

A4: a silicone resin polysiloxane mixture having a viscosity of 2,000 mPa s and consisting of 65 mass % of a dimethylpolysiloxane blocked with dimethylvinylsiloxy groups at both terminals of a molecular chain (vinyl group content=0.23 mass %) and 35 mass % of an organopolysiloxane resin consisting of $SiO_{4/2}$ units, $(CH_3)_3 SiO_{1/2}$ units, and $(CH_3)_2(CH_2=CH)SiO_{1/2}$ units (vinyl group content=2.5 mass %)

A5: an organopolysiloxane resin having a viscosity of 190 mPa s and consisting of $SiO_{4/2}$ units, $(CH_3)_3SiO_{1/2}$ units, and $(CH_3)_2(CH_2=CH)SiO_{1/2}$ units (vinyl group content=5.1 mass %)

A6: a dimethylpolysiloxane/methylphenylpolysiloxane copolymer blocked with dimethylvinylsiloxy groups at both terminals of a molecular chain, having a viscosity of 2,000 mPa s at 20° C. (vinyl group content=0.26 mass %, phenyl group content=8.9 mass %)

B1: a methylhydrogensiloxane/dimethylsiloxane copolymer blocked with trimethylsiloxy groups at both terminals of a molecular chain, having a viscosity of 60 mPa s at 20° C. (content of silicon atom-bonded hydrogen atoms=0.7 mass %)

B2: a methylhydrogensiloxane-dimethylsiloxane copolymer blocked with trimethylsiloxy groups at both terminals of a molecular chain having a viscosity of 30 mPa s at 20° C. (content of silicon atom-bonded hydrogen atoms=0.13 mass %)

B3: a methylhydrogenpolysiloxane blocked with trimethylsiloxy groups at both terminals of a molecular chain having a viscosity of 20 mPa s at 20° C. (content of silicon atom-bonded hydrogen atoms=1.55 mass %)

C1: a complex of platinum having a platinum concentration of 0.6 mass % and 1,3-divinyl-1,1,3,3-tetramethyldisiloxane D1: a masterbatch with 80 mass % of component A3 and 20 mass % of silazane treatment dry silica described above (having an average primary particle diameter of 0.1 to 0.2 μm as measured by a laser diffraction/scattering method)

D2: a masterbatch with 70 mass % of component A6 and 30 mass % of silazane treatment dry silica described above (having an average primary particle diameter of 0.1 to 0.2 μm as measured by a laser diffraction/scattering method)

E1: a condensation reaction product of 3-glycidoxypropyl trimethoxysilane and a methylvinylsiloxane oligomer blocked with hydroxyl groups at both terminals of a molecular chain, having a viscosity of 30 mPa s at a mass ratio of 1:1

F1-ethynylcyclohexanol

F2: 1,3,5,7-tetramethyl-1,3,5,7-tetravinyl-cyclotetrasiloxane

[Preparation of the Curable Organopolysiloxane Composition]

Each of the abovementioned components other than component (C1) was uniformly mixed at the mass ratio (parts by mass) indicated in Table 1 below, with component (C1) finally mixed in at the mass ratio (parts by mass) indicated in Table 1, then filled into a 10 cc syringe available from Musashi Engineering Co., Ltd. after vacuum defoaming to obtain the compositions of Example 1 to 2 and Comparative Example 1 to 2.

TABLE 1

| | Experiment Example | | | |
|---|---|---|---|---|
| Component | Example 1 | Example 2 | Comparative Example 1 | Comparative Example 2 |
| A1 | 9.5 | | 18.0 | |
| A2 | | 30 | 49.6 | |
| A3 | | 10 | | |
| A4 | 30.6 | | | |
| A5 | | 10 | | |
| A6 | 20 | 13 | | 78 |
| B1 | 5.1 | 8.2 | 7.5 | |
| B2 | 6.0 | | | |
| B3 | | | | 0.7 |
| C1 | 0.1 | 0.1 | 0.2 | 0.1 |
| D1 | | | 23.0 | |
| D2 | 27 | 27 | | 20 |
| E1 | 1.0 | 1.0 | 1.0 | 1.0 |
| F1 | 0.2 | 0.2 | 0.2 | 0.2 |
| F2 | 0.5 | 0.5 | 0.5 | |
| SiH/Vi mole ratio | 1.5 | 1.5 | 1.7 | 1.1 |
| Phenyl group content (Mass %) | 3.4 | 2.8 | 0 | 8.2 |

TABLE 1-continued

|  |  | Experiment Example | | | |
|---|---|---|---|---|---|
| Component | | Example 1 | Example 2 | Comparative Example 1 | Comparative Example 2 |
| Hardness (JIS TYPE A) | | 47 | 48 | 40 | 22 |
| Complex shear elastic modulus (G*) (MPa) | $G_1^*$ (−70° C.) | 0.76 | 0.67 | 123 | 0.23 |
| | $G_2^*$ (25° C.) | 0.75 | 0.67 | 0.56 | 0.33 |
| Cold resistance evaluation | $G_1^*/G_2^*$ | 1.0 (pass) | 1.0 (pass) | 222 (fail) | 0.7 (pass) |
| Viscosity (Pa s) | at 0.1/s | 116 | 159 | 109 | 123 |
| | at 1000/s | 1.78 | 1.18 | 0.65 | 2.59 |
| Thixotropic index | (at 0.1/s)/(at 1000/s) | 65.1 | 134.7 | 167.7 | 47.5 |
| Jet dispensing properties | Average application diameter (μm) | 791 | 764 | 753 | Incapable of dispensing |
| | Average mass/1 shot (μg) | 45 | 39 | 23 | |

The technical effects of the present invention were tested as follows.

[Viscosity]

The viscosity (Pa s) of the composition at 25° C. was determined using a rheometer MCR-102 (available from Anton Paar GmbH). A geometry having a diameter of 20 mm and using 2 degree cone type was determined, wherein after a preshear of 10 (1/s), 60 s, and an equilibration time (post-pre-shear stop time) of 60 s, the strain speed was increased from 0.05 (1/s) to 5000 (1/s) and the strain speed increase rate was increased at 120 s/decade. The determination results of the viscosity of each composition and the viscosity at a strain speed of 0.1 (1/s) divided by the viscosity at a strain speed of 1,000 (1/s) are indicated together in Table 1 as a "thixotropic index".

Hardness of Cured Product

The hardness of the cured product of the composition was determined using a type A durometer specified in JIS K 6253.

[Complex Shear Elastic Modulus]

The cured product obtained by heating and curing the composition at 150° C. for 60 minutes was determined using a rheometer MCR-302 (available from Anton Paar GmbH). The elastic modulus was determined while increasing the temperature from −100° C. to 100° C. at 3° C./minute to obtain the value of the complex shear elastic modulus (hereinafter, abbreviated as G*) at −70° C. and 25° C. Here, when [(G*(G*1) at −70° C.)/(G*(G*2) at 25° C.)] is 10 or less, passing of cold resistance is determined and indicated in Table 1 together with the value of G* at −70° C. and 25° C.

[Jet Dispensing Test]

Regarding application tests using a jet dispenser for each composition, application was carried out using an apparatus having the apparatus configuration of Table 2 below, available from Musashi Engineering Co., Ltd., wherein the base material was applied to a 20 mm×20 mm silicon chip in a pattern of 7×7 dots (Examples 1 to 2) in 1.4 mm intervals. Similarly, application was carried out in a pattern of 6×6 dots (Comparative Example 1). The average application diameter (μm) and the average application amount per shot (mass, μg) during application are indicated in Table 1. Note that when the abovementioned "thixotropic index" was less than 50, the application test using the jet dispenser was incapable of being carried out and thus regarded as "incapable of dispensing."

TABLE 2

| Dispensing table | Shot Master 300DS-S |
|---|---|
| Controller | Jet Master 3 |
| Dispensing head | Aero Jet MJET-A |
| Valve sheet | V |
| Nozzle | 36G |

[Summary]

Figure 1:
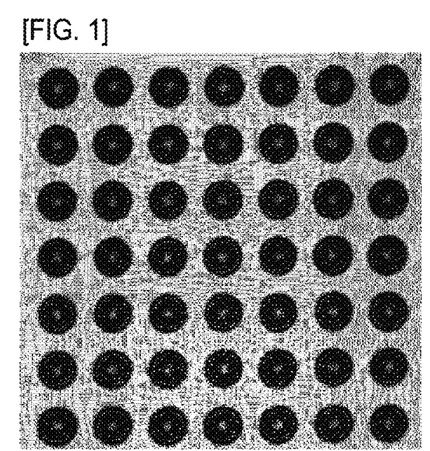
FIG. 1 is a result of applying a curable organopolysiloxane composition according to Example 1 to a silicon chip of 20 mm×20 mm using a jet dispenser, achieving a small amount and a precise application diameter.
Figure 2:
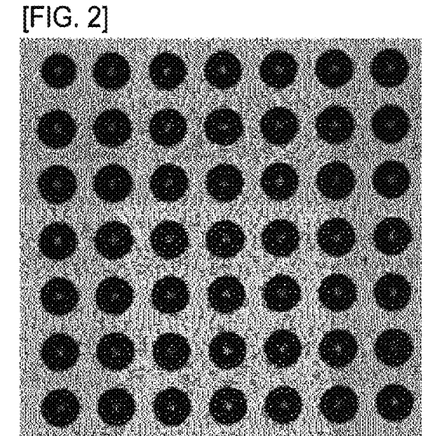
FIG. 2 is a result of applying a curable organopolysiloxane composition according to Example 2 to a silicon chip of 20 mm×20 mm using a jet dispenser, achieving a small amount and a precise application diameter.

As indicated in Table 1, the compositions of Examples 1 and 2 meet the requirements of the present invention. That is, they are curable organopolysiloxane compositions, wherein the viscosity at a strain speed of 1,000 (1/s) is 2.0 Pa s or less and sufficiently low, while the viscosity at a strain speed of 0.1 (1/s) is a value (=thixotropic index) 50.0-fold or more the viscosity at a strain speed of 1,000 (1/s), with the fluidity after dispensing low controlled to be low. As indicated in Table 1 and FIGS. 1 and 2, the compositions of Examples 1 and 2 can be precisely applied to an average coating diameter range of 800 μm or less using a jet dispenser which is a fine droplet coating apparatus. Further, it has been confirmed that the content of the silicon atom-bonded aromatic functional groups (phenyl groups) derived from components A6 and D1 of the raw material is within a predetermined range of the present application, wherein G* of the cured product at −70° C. is 10-fold or less G* at 25° C., that is, no rapid change in the elastic modulus is observed even from the ultra-low temperature region to room temperature, the cold resistance of the cured product is good, and the cured product can be used within a wide temperature range.

Figure 3:
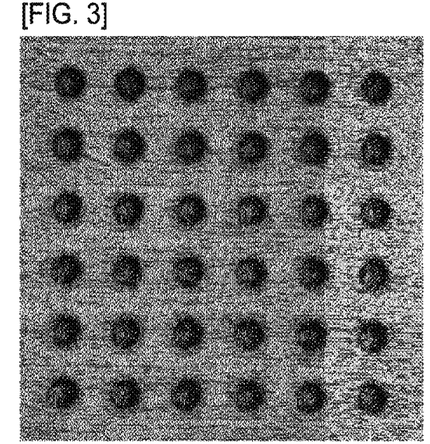
FIG. 3 is a result of applying a curable organopolysiloxane composition according to Comparative Example 1 to a silicon chip of 20 mm×20 mm using a jet dispenser, achieving a small amount and a precise application diameter. However, the cured product of the coating material has insufficient cold resistance.

In contrast, regarding the composition of Comparative Example 1, when the content of the silicon atom-bonded aromatic functional groups in the composition was 0 mass % and a jet dispenser which is a fine droplet coating apparatus was used, precise application was possible within an average coating diameter range of 800 μm or less (FIG. 3). However, G* of the cured product at −70° C. was 100-fold or more G* at 25° C. and the cold resistance of the cured product was incapable of being achieved as in Example 1 or 2. Note that when the determination was carried out under the above-mentioned conditions using a rheometer MCR-302 (available from Anton Paar GmbH), it was confirmed that the cured product of Comparative Example 1 had insufficient cold resistance at −50° C. or lower due to rapid changes in G* in the vicinity of −50° C.

In addition, although the composition of Comparative Example 2 had an excessive content of silicon atom-bonded aromatic functional groups (phenyl groups) derived from components A6 and D1 of the raw materials and certain cold resistance was capable of being achieved, the viscosity at a strain speed of 1,000 (1/s) was 2.0 Pa s or more, while the viscosity at a strain speed of 0.1 (1/s) was a value less than 50.0-fold the viscosity at a strain speed of 1,000 (1/s). Therefore, neither stable jet ejection nor precise application was possible upon using a jet dispenser which is a fine droplet coating apparatus.

The invention claimed is:

1. A curable organopolysiloxane composition which is a liquid adapted for pattern formation applications, the curable organopolysiloxane composition comprising:
   (A) 100 parts by mass of an alkenyl group-containing organopolysiloxane having a viscosity of from 10 to 100,000 mPa·s at 25° C.;
   (B) an organohydrogenpolysiloxane present in an amount in which the silicon atom-bonded hydrogen atoms in component (B) are 0.2 to 5 mols with respect to 1 mol of alkenyl groups contained in component (A);
   (C) a catalytic amount of a hydrosilylation reaction catalyst;
   (D) 2.5 to 20.0 parts by mass of a functional filler having an average particle diameter of from 0.01 to 10 um as measured by a laser diffraction/scattering method;
   (E) one or more adhesion promoters; and
   (F) a hydrosilylation reaction inhibitor;
   wherein at least a portion of component (A) or component (B) is an organopolysiloxane having silicon atom-bonded aromatic functional groups;
   wherein the curable organopolysiloxane composition has a viscosity at a strain speed of 1,000 (1/s) which is 2.0 Pa·s or less;
   wherein, the curable organopolysiloxane composition has a viscosity at a strain speed of 0.1 (1/s) which is a value 50.0-fold or more relative to the viscosity at a strain speed of 1,000 (1/s); and
   wherein the content of silicon atom-bonded aromatic functional groups in the curable organopolysiloxane composition is within a range of from 1.0 to 6.0 mass %.

2. The curable organopolysiloxane composition according to claim 1, wherein the viscosity at a strain speed of 1,000 (1/s) is 1.5 Pa·s or less, while the viscosity at a strain speed of 0.1 (1/s) is 50 Pa·s or more.

3. The curable organopolysiloxane composition according to claim 1, wherein component (A) c (A1) an alkenyl group-containing organopolysiloxane having a viscosity of from 10 to 100,000 mPa·s at 25° C. in addition to containing silicon atom-bonded aromatic functional groups within a range of from 2.0 to 25.0 mass %.

4. The curable organopolysiloxane composition according to claim 1, wherein component (D) has at least (D1) a reinforcing filler having an average primary particle diameter within a range of from 0.01 to 0.5 μm.

5. The curable organopolysiloxane composition according to claim 1, wherein component (F) is a mixture of (F1) an acetylenic hydrosilylation reaction inhibitor and (F2) a cycloalkenylsiloxane based hydrosilylation reaction inhibitor.

6. The curable organopolysiloxane composition according to claim 1, which is a liquid adapted for application by a fine droplet coating apparatus.

7. A method for forming a pattern, the method comprising applying the curable organopolysiloxane composition according to claim 1 onto a base material via a fine droplet coating apparatus.

8. The method for forming a pattern according to claim 7, wherein the pattern includes at least one region selected from the group consisting of: i) application regions obtained by applying the curable organopolysiloxane composition to an application region housed within a frame having vertical and lateral lengths of 1000 μm; ii) linear regions having a linear width of 1000 μm or less; or iii) combinations thereof; and wherein the fine droplet coating apparatus has a nozzle diameter of 1000 μm or less.

9. An electronic component or precursor thereof, comprising a structure formed by applying the curable organopolysiloxane composition according to claim 1 or a cured product thereof to at least one region.

10. The electronic component or precursor thereof according to claim 9, wherein the curable organopolysiloxane composition is applied via a fine droplet coating apparatus.

11. The electronic component or precursor thereof according to claim 9, wherein the electronic component is a semiconductor device.

12. The electronic component or precursor thereof according to claim 9, wherein the electronic component is a micro electromechanical systems (MEMS) device.

* * * * *